United States Patent
Yang et al.

(10) Patent No.: US 11,903,274 B2
(45) Date of Patent: Feb. 13, 2024

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Lulu Yang, Beijing (CN); Tinghua Shang, Beijing (CN); Guomeng Zhang, Beijing (CN); Yu Wang, Beijing (CN); Xiaofeng Jiang, Beijing (CN); Xin Zhang, Beijing (CN); Yupeng He, Beijing (CN); Yi Qu, Beijing (CN); Biao Liu, Beijing (CN); Mengmeng Du, Beijing (CN); Xiangdan Dong, Beijing (CN); Hongwei Ma, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 407 days.

(21) Appl. No.: 17/299,565

(22) PCT Filed: Sep. 10, 2020

(86) PCT No.: PCT/CN2020/114559
§ 371 (c)(1),
(2) Date: Jun. 3, 2021

(87) PCT Pub. No.: WO2021/217993
PCT Pub. Date: Nov. 4, 2021

(65) Prior Publication Data
US 2022/0320226 A1 Oct. 6, 2022

(30) Foreign Application Priority Data
Apr. 26, 2020 (WO) ............... PCT/CN2020/086997

(51) Int. Cl.
*H10K 59/131* (2023.01)
*H10K 50/813* (2023.01)
(Continued)

(52) U.S. Cl.
CPC ......... *H10K 59/131* (2023.02); *H10K 50/813* (2023.02); *G09G 3/3233* (2013.01);
(Continued)

(58) Field of Classification Search
CPC .. H10K 59/351; H10K 50/813; H10K 59/131; G09G 2300/0426; G09G 3/3233
See application file for complete search history.

(56) References Cited

U.S. PATENT DOCUMENTS 10,381,381 B1 * 8/2019 Choi .................. H10K 59/00
11,348,523 B2 * 5/2022 Chen ................ G09G 3/3233
(Continued)

FOREIGN PATENT DOCUMENTS

| | | |
|---|---|---|
| CN | 109301088 A | 2/2019 |
| EP | 3 480 807 A1 | 5/2019 |
| WO | 2019153938 A1 | 5/2020 |

OTHER PUBLICATIONS

Extended European Search Report in European Application No. 20929680.5 dated Jul. 25, 2023.
(Continued)

*Primary Examiner* — Nicholas J Tobergte
(74) *Attorney, Agent, or Firm* — Collard & Roe, P.C.

(57) ABSTRACT

A display substrate and a display device are provided. In the display substrate, each of the plurality of anode groups includes a first anode and a second anode, the first anode includes a first main body portion, a first connection portion, an extension portion and an anode compensation portion, an orthographic projection of the anode compensation portion on the base substrate covers one thin film transistor, the
(Continued)

anode compensation portion has a first point at a side away from the second center line, and the first main body portion has a second point at the first side, the first anode and a connection line between the first point and the second point enclose a notch region, and an area of the notch region is greater than at least one of an area of the anode compensation portion and an area of the first connection portion.

20 Claims, 7 Drawing Sheets

(51) Int. Cl.
  *G09G 3/3233* (2016.01)
  *H10K 59/35* (2023.01)
(52) U.S. Cl.
  CPC ............... *G09G 2300/0426* (2013.01); *G09G 2300/0819* (2013.01); *G09G 2300/0842* (2013.01); *H10K 59/351* (2023.02)

(56) References Cited

U.S. PATENT DOCUMENTS

| | | |
|---|---|---|
| 2016/0240810 A1* | 8/2016 | Oh ..................... H10K 59/123 |
| 2016/0260792 A1 | 9/2016 | Kim et al. |
| 2018/0159064 A1 | 6/2018 | Wu et al. |
| 2018/0190752 A1 | 7/2018 | An et al. |
| 2020/0168692 A1 | 5/2020 | Liu et al. |

OTHER PUBLICATIONS

Extended European Search Report in European Application No. 20904234.0 dated Sep. 14, 2023.

* cited by examiner

DISPLAY SUBSTRATE AND DISPLAY DEVICE

CROSS REFERENCE TO RELATED APPLICATIONS

This application is the National Stage of PCT/CN2020/114559 filed on Sep. 10, 2020, which claims priority under PCT/CN2020/086997 filed on Apr. 26, 2020, the disclosure of which is incorporated by reference.

TECHNICAL FIELD

Embodiments of the present disclosure relate to a display substrate and a display device.

BACKGROUND

With the continuous development of display technology, organic light-emitting diode (OLED) display technology has been increasingly used in various electronic devices because of its advantages of self-illumination, wide viewing angle, wide color gamut, high contrast, low power consumption and high reaction speed.

On the other hand, with the continuous development of organic light-emitting diode display technology, people put forward higher requirements for the performance of organic light-emitting diode display products such as power consumption, color cast, brightness and stability.

SUMMARY

Embodiments of the present disclosure provide a display substrate and a display device. The display substrate includes: a base substrate; a pixel circuit layer on the base substrate; an anode layer located at a side of the pixel circuit layer away from the base substrate. The pixel circuit layer includes a plurality of pixel driving circuits, the anode layer includes a plurality of anodes, the plurality of pixel driving circuits are arranged in one-to-one correspondence with the plurality of anodes, the plurality of anodes include a plurality of anode groups arranged in an array along a first direction and a second direction, each of the plurality of anode groups includes a first anode and a second anode which are oppositely arranged in the second direction. The first anode includes a first main body portion and a first connection portion, and the first connection portion is electrically connected to a pixel driving circuit corresponding to the first anode. The first anode also includes an extension portion and an anode compensation portion, the orthographic projection of the anode compensation portion on the base substrate covers one thin film transistor in the pixel driving circuit connected to the first connection portion, the first main body portion and the anode compensation portion at least partially overlap in the first direction, the first center line of the anode compensation portion extending in the second direction is located at a first side of the second center line of the first main body portion extending in the second direction. The anode compensation portion has a first point at a side away from the second center line, and the first main body portion has a second point at the first side, and the first anode and a connection line between the first point and the second point enclose a notch region, and the area of the notch region is greater than at least one of the area of the anode compensation portion and the area of the first connection portion. According to the display substrate, the shape of the first anode is designed, so that the extension portion of the first anode avoids the light transmitting region of the display substrate as much as possible, thereby improving the light transmittance of the display substrate.

At least one embodiment of the present disclosure provides a display substrate, which includes: a base substrate; a pixel circuit layer, on the base substrate; an anode layer, at a side of the pixel circuit layer away from the base substrate, wherein the pixel circuit layer includes a plurality of pixel driving circuits, the anode layer includes a plurality of anodes, and the plurality of pixel driving circuits are arranged in one-to-one correspondence with the plurality of anodes, the plurality of anodes include a plurality of anode groups arranged in an array along a first direction and a second direction, each of the plurality of anode groups includes a first anode and a second anode which are oppositely arranged in the second direction, the first anode includes a first main body portion and a first connection portion, and the first connection portion is electrically connected to a pixel driving circuit corresponding to the first anode, the first anode further includes an extension portion and an anode compensation portion, wherein an orthographic projection of the anode compensation portion on the base substrate covers one thin film transistor in the pixel driving circuit connected to the first connection portion, the first main body portion and the anode compensation portion at least partially overlap in the first direction, a first center line of the anode compensation portion extending in the second direction is at a first side of a second center line of the first main body portion extending in the second direction, the anode compensation portion has a first point at a side away from the second center line, and the first main body portion has a second point at the first side, the first anode and a connection line between the first point and the second point enclose a notch region, and an area of the notch region is greater than at least one of an area of the anode compensation portion and an area of the first connection portion.

For example, in the display substrate provided by an embodiment of the present disclosure, the area of the notch region is greater than a sum of the area of the anode compensation portion and the area of the first connection portion.

For example, in the display substrate provided by an embodiment of the present disclosure, the anode compensation portion is at the first side of the second center line of the first main body portion extending in the second direction.

For example, in the display substrate provided by an embodiment of the present disclosure, the extension portion includes a first extension portion and a second extension portion, the first extension portion is at a side of the first connection portion away from the first main body portion, the second extension portion is respectively connected to the first extension portion and the anode compensation portion, and the first extension portion is at a side of the second extension portion away from the anode compensation portion.

For example, in the display substrate provided by an embodiment of the present disclosure, a third center line of the first extension portion extending in the second direction is at a second side of the second center line of the first main body portion extending in the second direction, and the second side is opposite to the first side.

For example, in the display substrate provided by an embodiment of the present disclosure, the first extension portion is at the second side of the second center line of the first main body portion extending in the second direction.

For example, in the display substrate provided by an embodiment of the present disclosure, an orthographic projection of the notch region on the base substrate does not overlap with an orthographic projection of the first anode on the base substrate.

For example, in the display substrate provided by an embodiment of the present disclosure, a fourth center line of the first connection portion extending in the second direction is at the first side of the second center line of the first main body portion.

For example, in the display substrate provided by an embodiment of the present disclosure, each of the plurality of pixel driving circuits includes a driving thin film transistor and a compensation thin film transistor, a drain electrode of the driving thin film transistor and a source electrode of the compensation thin film transistor are connected to a first node, an orthographic projection of the anode compensation portion on the base substrate covers the first node of a pixel driving circuit connected to the first connection portion.

For example, in the display substrate provided by an embodiment of the present disclosure, a size of the first connection portion in the first direction is smaller than a size of the first main body portion in the first direction, and a size of the first extension portion in the first direction is smaller than a size of the first connection portion in the first direction.

For example, in the display substrate provided by an embodiment of the present disclosure, each of the plurality of anode groups further includes a third anode and a fourth anode; in each of the plurality of anode groups, the first anode and the second anode form an anode pair, the third anode, the anode pair and the fourth anode are arranged in sequence in the first direction, and the first anode and the second anode are arranged in sequence in the second direction.

For example, in the display substrate provided by an embodiment of the present disclosure, the notch region includes a first notch between the first main body portion and the anode compensation portion, an orthographic projection of the first notch on the base substrate includes a first edge and a second edge extending in the second direction, the first edge is connected to an orthographic projection of the first connection portion on the base substrate, and the second edge is on a connection line between the first point and the second point.

For example, in the display substrate provided by an embodiment of the present disclosure, an area of the orthographic projection of the first notch on the base substrate is greater than ½ of an area of the orthographic projection of the first connection portion on the base substrate.

For example, in the display substrate provided by an embodiment of the present disclosure, the notch region further includes a second notch between the first notch and the anode compensation portion, an orthographic projection of the second notch on the base substrate includes a fourth edge and a fifth edge extending in the second direction, the fourth edge is connected to an orthographic projection of the first extension portion on the base substrate, and the fifth edge is also on the connection line between the first point and the second point.

For example, in the display substrate provided by an embodiment of the present disclosure, an area of the orthographic projection of the second notch on the base substrate is greater than ½ of an area of the orthographic projection of the first connection portion on the base substrate.

For example, in the display substrate provided by an embodiment of the present disclosure, the second anode includes a second main body portion and a second connection portion, the second main body portion is electrically connected to a pixel driving circuit corresponding to the second anode, and an orthographic projection of the second main body portion on the base substrate covers a first node of the pixel driving circuit electrically connected to the second connection portion, the first connection portion and the second connection portion are symmetrically arranged about a symmetry axis parallel to the first direction, wherein the first connection portion is at a side of the first main body portion away from the second main body portion, and the second connection portion is at a side of the second main body portion away from the first main body portion.

For example, in the display substrate provided by an embodiment of the present disclosure, the second anode further includes a first supplementary portion, the first supplementary portion is protruded from the second main body portion in a direction the second main body portion close to the first anode, an orthographic projection of the first supplementary portion on the base substrate at least partially overlaps with an orthographic projection of a channel region of the compensation thin film transistor in the pixel driving circuit electrically connected to the second connection portion on the base substrate.

For example, in the display substrate provided by an embodiment of the present disclosure, each of the plurality of pixel driving circuits further includes a storage capacitor and a light-emitting control line, the storage capacitor includes a first electrode plate and a second electrode plate arranged in a direction perpendicular to the base substrate, the first main body portion is at a side of the light-emitting control line in the pixel driving circuit connected to the first connection portion away from the storage capacitor, and the anode compensation portion is at a side of the light-emitting control line away from the first main body portion.

For example, in the display substrate provided by an embodiment of the present disclosure, each of the plurality of pixel driving circuits further includes a data line and a power line, in each of the plurality of pixel driving circuits, an orthographic projection of the second electrode plate on the base substrate, an orthographic projection of the light-emitting control line on the base substrate, the data line and the power line enclose a first interval region, and an area of the first interval region covered by an orthographic projection of the first extension portion on the base substrate is smaller than ½ of a total area of the first interval region.

For example, in the display substrate provided by an embodiment of the present disclosure, each of the plurality of pixel driving circuits further includes an initialization signal line, an orthographic projection of the light-emitting control line in a pixel driving circuit corresponding to the first anode on the base substrate, an orthographic projection of the initialization signal line in a pixel driving circuit corresponding to the second anode on the base substrate, the data line and the power line enclose a second interval region, and an area of the second interval region covered by an orthographic projection of the first anode on the base substrate is smaller than ⅔ of a total area of the second interval region.

For example, in the display substrate provided by an embodiment of the present disclosure, the third anode includes a third main body portion and a third connection portion, and the third connection portion is electrically connected to a pixel driving circuit corresponding to the third anode; the fourth anode includes a fourth main body portion and a fourth connection portion, and the fourth connection portion is electrically connected to a pixel driving circuit corresponding to the fourth anode.

For example, in the display substrate provided by an embodiment of the present disclosure, the fourth anode further includes a second supplementary portion protruding from the fourth main body portion in a direction the fourth main body portion close to the second anode, an orthographic projection of the second supplementary portion on the base substrate at least partially overlaps with an orthographic projection of a channel region of the compensation thin film transistor in the pixel driving circuit electrically connected to the third connection portion on the base substrate.

For example, in the display substrate provided by an embodiment of the present disclosure, the fourth anode further includes a third supplementary portion protruding from the fourth main body portion in a direction the fourth main body portion away from the second anode, an orthographic projection of the third supplementary portion on the base substrate at least partially overlaps with an orthographic projection of a channel region of the compensation thin film transistor in the pixel driving circuit electrically connected to the first connection portion on the base substrate.

For example, the display substrate provided by an embodiment of the present disclosure further includes a pixel defining layer at a side of the anode layer away from the base substrate; and a light-emitting layer at a side of the anode layer away from the base substrate, wherein the pixel defining layer includes a plurality of openings, the plurality of openings are arranged in one-to-one correspondence with the plurality of anodes, and each of the plurality of openings partially exposes a corresponding anode of the plurality of anodes, the light-emitting layer includes a plurality of light-emitting portions, the plurality of light-emitting portions are arranged in one-to-one correspondence with the plurality of openings, and at least a part of each of the plurality of light-emitting portions is in a corresponding one of the plurality of opening and covers an exposed part of a corresponding anode of the plurality of anodes.

For example, in the display substrate provided by an embodiment of the present disclosure, the plurality of openings are divided into a plurality of opening groups, each of the plurality of opening groups includes a first opening and a second opening, and the plurality of light-emitting portions are divided into a plurality of light-emitting portion groups, each of the plurality of light-emitting portion groups includes a first light-emitting portion and a second light-emitting portion, an orthographic projection of the first opening on the base substrate falls within an orthographic projection of the first main body portion on the base substrate, at least a part of the first light-emitting portion is in the first opening and covers an exposed part of the first main body portion, and a shape of the orthographic projection of the first main body portion on the base substrate is similar to a shape of the orthographic projection of the first opening on the base substrate.

For example, in the display substrate provided by an embodiment of the present disclosure, the pixel circuit layer includes: a semiconductor layer on the base substrate; and a first gate electrode layer at a side of the semiconductor layer away from the base substrate, wherein the semiconductor layer includes a plurality of pixel driving units which are arranged in one-to-one correspondence with the anodes, each of the plurality of pixel driving units includes a first unit, a second unit, a third unit, a fourth unit, a fifth unit, a sixth unit and a seventh unit, the first unit includes a first channel region, and a first source region and a first drain region at two sides of the first channel region, the second unit includes a second channel region, and a second source region and a second drain region at two sides of the second channel region, the third unit includes a third channel region, and a third source region and a third drain region at two sides of the third channel region, the fourth unit comprises a fourth channel region, and a fourth source region and a fourth drain region at two sides of the fourth channel region, the fifth unit includes a fifth channel region, and a fifth source region and a fifth drain region at two sides of the fifth channel region, the sixth unit includes a sixth channel region, and a sixth source region and a sixth drain region at two sides of the sixth channel region, the seventh unit includes a seventh channel region, and a seventh source region and a seventh drain region at two sides of the seventh channel region, the third source region, the first drain region and the fifth source region are connected to the first node, the sixth drain region is connected to the third drain region, the first source region, the second drain region and the fourth drain region are connected to the second node, the fifth drain region is connected to the seventh drain region, the first gate electrode layer includes a reset signal line, a gate line, a first electrode block and a light-emitting control line, wherein the reset signal line overlaps with the seventh channel region and the sixth channel region to form a seventh thin film transistor and a sixth thin film transistor with the seventh unit and the sixth unit, and the gate line respectively overlaps with the third channel region and the second channel region to form a third thin film transistor and a second thin film transistor with the third unit and the second unit, the first electrode block overlaps with the first channel region to form a first thin film transistor with the first unit, and the light-emitting control line overlaps with the fourth channel region and the fifth channel region to form a fourth thin film transistor and a fifth thin film transistor with the fourth unit and the fifth unit, the first thin film transistor is the driving thin film transistor, and the third thin film transistor is the compensation thin film transistor.

For example, in the display substrate provided by an embodiment of the present disclosure, the reset signal line, the gate line and the light-emitting control line all extend in the first direction, and the reset signal line, the gate line, the first electrode block and the light-emitting control line are arranged in the second direction.

For example, in the display substrate provided by an embodiment of the present disclosure, the pixel circuit layer includes: a second gate electrode layer at a side of the first gate electrode layer away from the semiconductor layer; wherein the second gate electrode layer includes an initialization signal line and a second electrode block, the initialization signal line is connected to the seventh source region and the sixth source region, and an orthographic projection of the second electrode block on the base substrate at least partially overlaps with an orthographic projection of the first electrode block on the base substrate to form a storage capacitor.

For example, in the display substrate provided by an embodiment of the present disclosure, the pixel circuit layer further includes: a source-drain electrode layer at a side of the second gate electrode layer away from the first gate electrode layer, wherein the source-drain electrode layer includes the data line and the power line, the second source region is connected to the data line, and the fourth source region is connected to the power line.

For example, in the display substrate provided by an embodiment of the present disclosure, the source-drain electrode layer further includes: a connection block including a first end and a second end, the first end is connected to the drain region of the compensation thin film transistor, and the second end is connected to the first electrode block, wherein an orthographic projection of the anode compensation portion on the base substrate covers an orthographic projection of the second end on the base substrate.

At least one embodiment of the present disclosure further provides a display device comprising any one of the display substrates as described above.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

Figure 1:
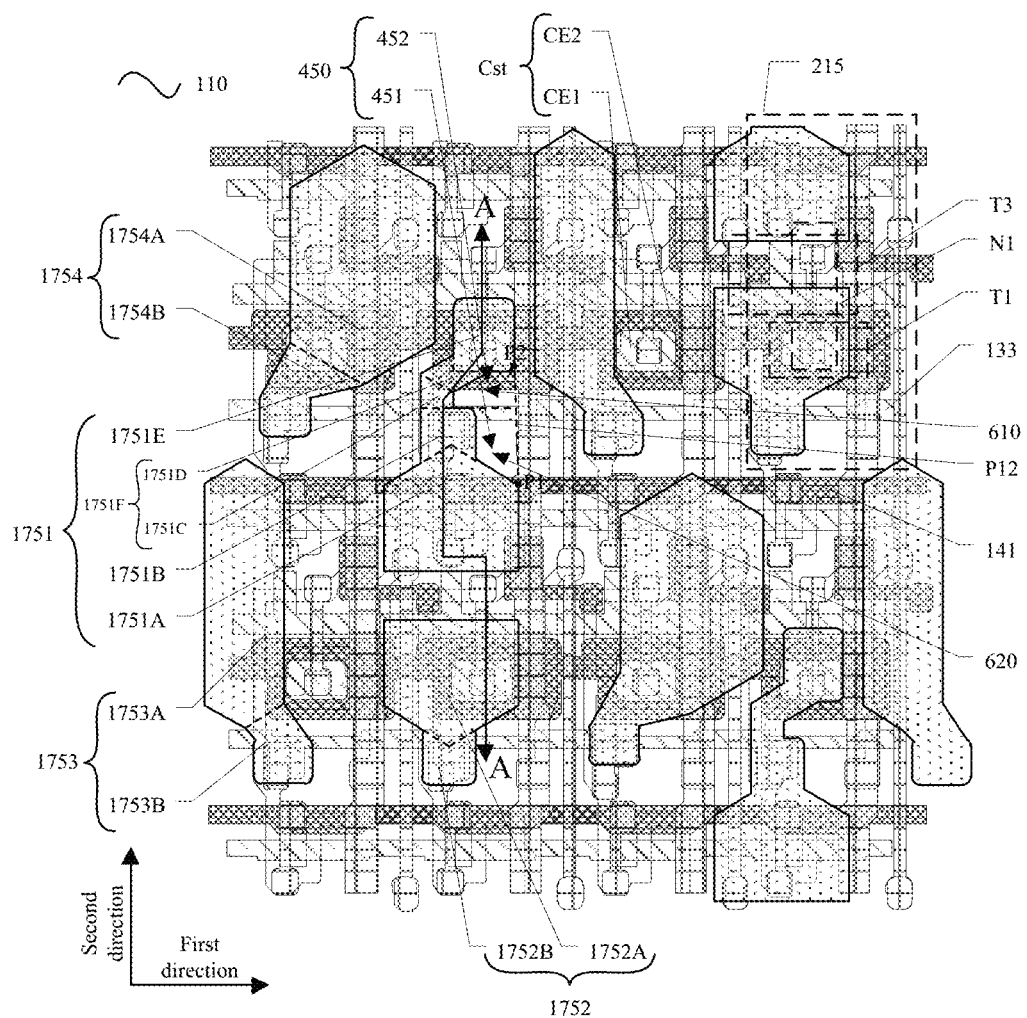
FIG. 1 is a schematic plan view of a display substrate according to an embodiment of the present disclosure.

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "include," "including," "include," "including," etc., are intended to specify that the elements or the objects stated before these terms encompass the elements or the objects and equivalents thereof listed after these terms, but do not preclude the other elements or objects.

With the popularization and application of organic light-emitting diode display panels, the requirements for light transmittance of organic light-emitting diode display panels are getting higher and higher. How to improve the light transmittance of organic light-emitting diode display panel has become an urgent problem to be solved.

Embodiments of the present disclosure provide a display substrate and a display device. The display substrate includes: a base substrate; a pixel circuit layer on the base substrate; an anode layer located at a side of the pixel circuit layer away from the base substrate. The pixel circuit layer includes a plurality of pixel driving circuits, the anode layer includes a plurality of anodes, the plurality of pixel driving circuits are arranged in one-to-one correspondence with the plurality of anodes, the plurality of anodes include a plurality of anode groups arranged in an array along a first direction and a second direction, each of the plurality of anode groups includes a first anode and a second anode which are oppositely arranged in the second direction. The first anode includes a first main body portion and a first connection portion, and the first connection portion is electrically connected to a pixel driving circuit corresponding to the first anode. The first anode also includes an extension portion and an anode compensation portion, an orthographic projection of the anode compensation portion on the base substrate covers one thin film transistor in the pixel driving circuit connected to the first connection portion, the first main body portion and the anode compensation portion at least partially overlap in the first direction, a first center line of the anode compensation portion extending in the second direction is located at a first side of a second center line of the first main body portion extending in the second direction. The anode compensation portion has a first point at a side away from the second center line, and the first main body portion has a second point at the first side, and the first anode and a connection line between the first point and the second point enclose a notch region, and an area of the notch region is greater than at least one of an area of the anode compensation portion and an area of the first connection portion. According to the display substrate, the shape of the first anode is designed, so that the extension portion of the first anode avoids the light transmitting region of the display substrate as much as possible, thereby improving the light transmittance of the display substrate.

Next, the display substrate and the display device provided by the embodiment of the present disclosure will be described in detail with reference to the drawings.

Figure 2:
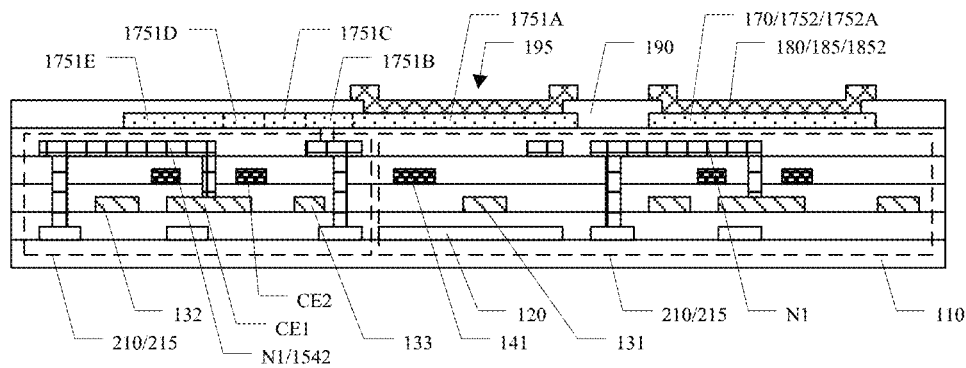
FIG. 2 is a schematic section view of a display substrate along the cutting line A-A in FIG. 1 according to an embodiment of the present disclosure.
Figure 3A:
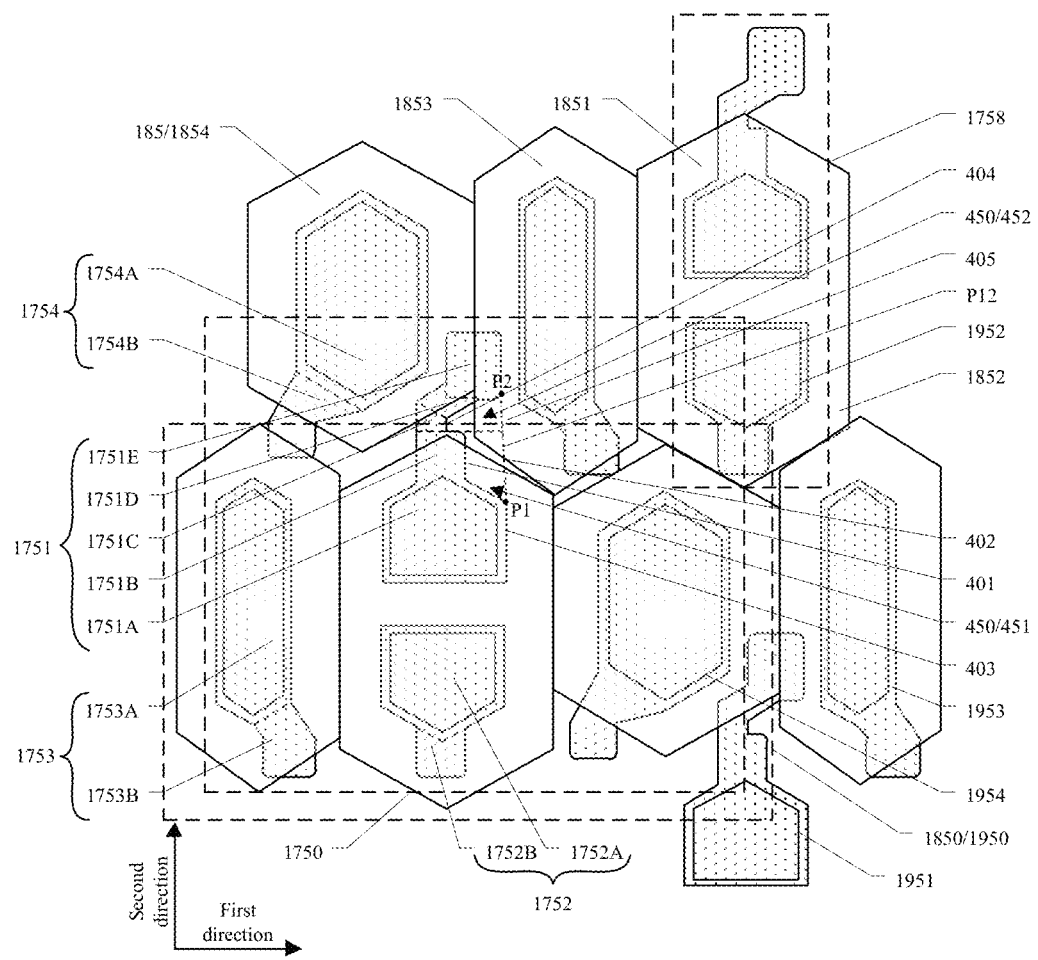
FIG. 3A is a schematic plan view of an anode layer in a display substrate according to an embodiment of the present disclosure.
Figure 3B:
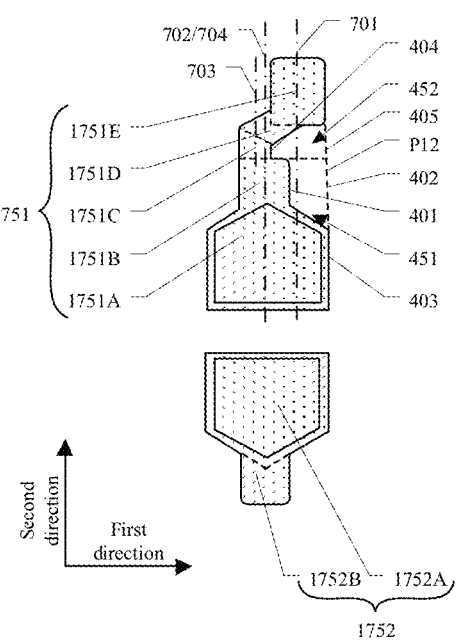
FIG. 3B is a schematic plan view of a first anode and a second anode in a display substrate according to an embodiment of the present disclosure.

FIG. 1 is a schematic plan view of a display substrate according to an embodiment of the present disclosure; FIG. 2 is a schematic section view of a display substrate along the cutting line A-A in FIG. 1 according to an embodiment of the present disclosure; FIG. 3A is a schematic plan view of an anode layer in a display substrate according to an embodiment of the present disclosure; FIG. 3B is a schematic plan view of a first anode and a second anode in a display substrate according to an embodiment of the present disclosure.

As illustrated in FIGS. 1, 2 and 3A, the display substrate 100 includes a base substrate 110, a pixel circuit layer 210 and an anode layer 170. The pixel circuit layer 210 is arranged on the base substrate 110, and the anode layer 170 is arranged at a side of the pixel circuit layer 210 away from the base substrate. The pixel circuit layer 210 includes a plurality of pixel driving circuits 215, and the anode layer 170 includes a plurality of anodes 175, the plurality of pixel driving circuits 215 and the plurality of anodes 175 are arranged in one-to-one correspondence, that is, one pixel driving circuit 215 corresponds to one anode 175 and is electrically connected to the corresponding anode 175 to provide the corresponding anode 175 with an electrical signal for driving the sub-pixel to emit light.

As illustrated in FIG. 1 and FIG. 3A, the plurality of anodes 175 include a plurality of anode groups 1750 arranged in an array along a first direction and a second direction, and each anode group 1750 includes a first anode 1751 and a second anode 1752 which are oppositely arranged. The first anode 1751 includes a first main body portion 1751A and a first connection portion 1751B, the first connection portion 1751B is electrically connected to the pixel driving circuit 215 corresponding to the first anode 1751, so that the pixel driving circuit 215 can apply an electrical signal driving the sub-pixel to the first anode 1751 including the first main body portion 1751A to emit light through the first connection portion 1751B.

As illustrated in FIG. 1, FIG. 3A and FIG. 3B, the first anode 1751 also includes an extension portion 1751F and an anode compensation portion 1751E. An orthographic projection of the anode compensation portion 1751E on the base substrate 110 covers one thin film transistor in a pixel driving circuit 215 connected to the first connection portion 1751B, the first main body portion 1751A and the anode compensation portion 1751E at least partially overlap in the first direction. A first center line 701 of the anode compensation portion 1751E extending in the second direction is located at a first side of a second center line 702 of the first main body portion 1751A extending in the second direction, the anode compensation portion 1751E has a first point P1 on a side away from the second center line 702, and the first main body portion 1751A has a second point P2 at the first side. The first anode 1751 and a connection line P12 between the first point P1 and the second point P2 enclose a notch region 450, and the area of the notch region 450 is greater than at least one of the area of the anode compensation portion 1751E and the area of the first connection portion 1751B.

In the display substrate provided by the embodiment of the present disclosure, the extension portion is used for connecting the anode compensation portion with the first connection portion; the first center line of the anode compensation portion extending in the second direction is located at the first side of the second center line of the first main body portion extending in the second direction, and the area of the notch region is greater than at least one of the area of the anode compensation portion and the area of the first connection portion, so that an overlapping area of the extension portion and the light transmitting region of the pixel driving circuit can be reduced. Therefore, the design of the first anode can make the extension portion of the first anode avoid the light transmitting region of the display substrate as much as possible, thereby improving the light transmittance of the display substrate. Because the display substrate has high light transmittance, a photosensitive device such as a camera and a fingerprint recognition module can be arranged below the display substrate.

In some examples, as illustrated in FIGS. 1 and 3A, in the notch region 450, the transmittances of at least two of all film layers between the base substrate 110 and the anode layer 170 of the display substrate are greater than 90%.

In some examples, as illustrated in FIGS. 1 and 3A, the area of the notch region 450 is greater than the sum of the area of the anode compensation portion 1751E and the area of the first connection portion 1751B. Therefore, the display substrate can further reduce the overlapping area of the extension portion and the light transmitting region of the pixel driving circuit, thereby further improving the light transmittance of the display substrate.

In some examples, as illustrated in FIGS. 1 and 3A, the anode compensation portion 1751E is located at the first side of the second center line of the first main body portion 1751A extending in the second direction. That is, the anode compensation portion 1751E is totally located at the first side of the second center line of the first main body portion 1751A extending in the second direction.

In some examples, as illustrated in FIGS. 1 and 3A, the orthographic projection of the notch region 450 on the base substrate 110 does not overlap with the orthographic projection of the first anode 1751 on the base substrate 110. That is, the notch region 450 does not belong to the first anode, but is a region surrounded by the first anode and the connection line P12 between the first point P1 and the second point P2.

In some examples, as illustrated in FIGS. 1, 3A and 3B, the distance between the first center line 701 of the anode compensation portion 1751E and the second center line 702 of the first main body portion 1751A is greater than or equal to ½ of the width of the anode compensation portion 1751E in the first direction.

In some examples, as illustrated in FIG. 1, FIG. 3A and FIG. 3B, a fourth center line 704 of the first connection portion 1751B extending in the second direction approximately coincides with the second center line 702 of the first main body portion 1751A. It should be noted that due to the limitation of process accuracy, the above-mentioned "approximately coincident" includes a case where the fourth center line and the second center line completely coincide, and also includes a case where the distance between the fourth center line and the second center line is less than ¹⁄₁₀ of the width of the first connection portion in the first direction. Of course, the embodiments of the present disclosure include but are not limited thereto, and the fourth center line of the first connection portion extending in the second direction can also be located at the first side of the first main body portion.

Figure 3C:
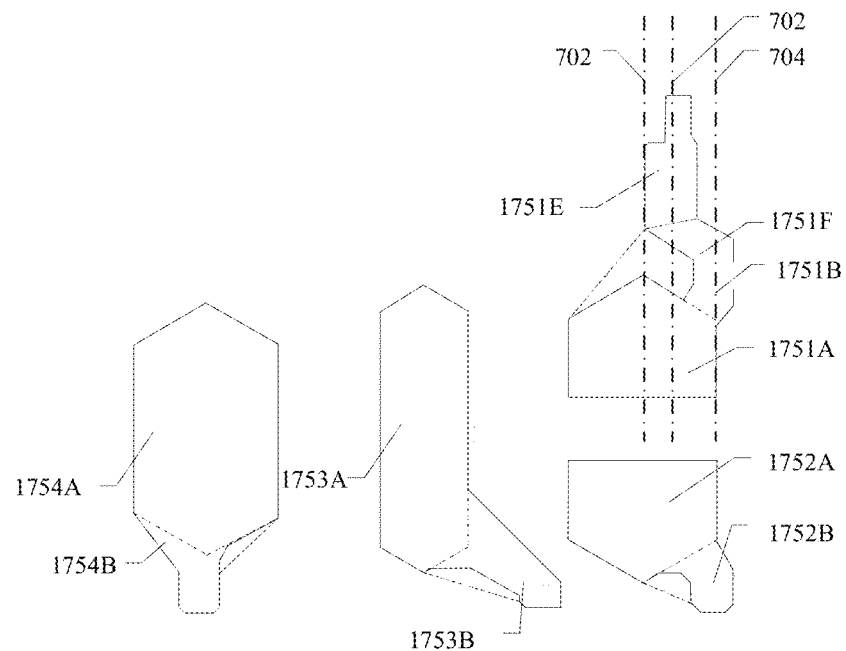
FIG. 3C is a schematic plan view of an anode layer in another display substrate according to an embodiment of the present disclosure.

FIG. 3C is a schematic plan view of an anode layer in another display substrate according to an embodiment of the present disclosure. As illustrated in FIG. 3C, a fourth center line 704 of the first connection portion 1751B extending in the second direction of the first anode 1751 is also located at the first side of the second center line 702 of the first main body portion 1751A extending in the second direction. That is, the fourth center line 704 and the first center line 701 of the anode compensation portion 1751E extending in the second direction are located on the same side of the second center line 702.

For example, the fourth center line 704 of the first connection portion 1751B is located at the side of the first center line 701 away from the second center line 702. Therefore, the first anode can make the first connection portion avoid the light transmitting region of the display substrate as much as possible, thereby further improving the light transmittance of the display substrate.

In some examples, as illustrated in FIG. 1, each pixel driving circuit 215 includes a driving thin film transistor T1 and a compensation thin film transistor T3, and a drain electrode D1 of the driving thin film transistor T1 and a source electrode S3 of the compensation thin film transistor T3 are connected to a first node N1. An orthographic projection of the anode compensation portion 1751E on the base substrate 110 covers the first node N1 of the pixel driving circuit 215 connected to the first connection portion 1751B, that is, the orthographic projection of the anode compensation portion 1751E on the base substrate 110 at least partially overlaps with the orthographic projection of the first node N1 of the pixel driving circuit 215 connected to the first connection portion 1751B on the base substrate 110. Because of the pixel arrangement structure, the shape and size of the first anode and the second anode etc., the first anode 1751 and the second anode 1752, which belong to the same anode pair 1758, are configured to drive sub-pixels to emit light of the same color. Because the main body portion of the second anode 1752 covers the first node N1 of the corresponding pixel driving circuit 215, the first main body portion 1751A does not cover the first node N1 of the corresponding pixel driving circuit 215, the anode compensation portion 1751E described above is added to the first anode 1751, and the orthographic projection of the anode compensation portion 1751E on the base substrate 110 covers the first node N1 of the pixel driving circuit 215 connected to the first connection portion 1751B, so that the load between the first anode 1751 and the corresponding first node N1 can be balanced with the load between the second anode 1752 and the corresponding first node N1, and thus the display quality can be improved.

In some examples, as illustrated in FIG. 1, the extension portion 1751F further includes a first extension portion 1751C and a second extension portion 1751D, the first extension portion 1751C is at a side of the first connection portion 1751B away from the first main body portion 1751A, the second extension portion 1751D is respectively connected to the first extension portion 1751C and the anode compensation portion 1751E, and the first extension portion 1751C is at a side of the second extension portion 1751D away from the anode compensation portion 1751E. Therefore, the first extension portion is located at the side of the first connection portion away from the first main body portion, and in this case, the first extension portion extends from the first connection portion instead of the first main body portion, so that the area of the first anode can be reduced. In addition, the first extension portion is located at the side of the second extension portion away from the anode compensation portion, so that the first extension portion is closer to the edge of the corresponding pixel driving circuit, and the overlapping area between the first extension portion and the light transmitting region of the pixel driving circuit is reduced. Therefore, the design of the first anode can make the first extension portion and the second extension portion of the first anode avoid the light transmitting region of the display substrate as much as possible, thereby improving the light transmittance of the display substrate.

For example, as illustrated in FIG. 1 and FIG. 2, the first node N1 can be a connection block 1542 arranged in the same layer as a data line 152 and a power line 151 in the pixel driving circuit 215. The specific setting of the connection block 1542 will be described in detail in the following layout schematic diagrams.

In some examples, as illustrated in FIGS. 1 and 3A, a third center line 703 of the first extension portion 1751C extending in the second direction is located at the second side of the second center line 702 of the first main body portion 1751A extending in the second direction, the second side is opposite to the first side. Therefore, the first anode can make the first extension portion avoid the light transmitting region of the display substrate as much as possible, thereby improving the light transmittance of the display substrate.

In some examples, as illustrated in FIGS. 1 and 3A, the first extension portion 1751C is located at the second side of the second center line 702 of the first main body portion 1751A extending in the second direction. That is to say, the first extension portion 1751C is totally located at the second side of the second center line of the first main body portion 1751A extending in the second direction, so that the overlapping area between the first extension portion and the light transmitting region of the display substrate can be further reduced, and the light transmittance of the display substrate can be further improved. In some examples, as illustrated in FIG. 1, the size of the first connection portion 1751B in the first direction is smaller than the size of the first main body portion 1751A in the first direction, and the size of the first extension portion 1751C in the first direction is smaller than the size of the first connection portion 1751B in the first direction, the first direction is perpendicular to the arrangement direction of the first main body portion 1751A, the first connection portion 1751B and the first extension portion 1751C. As illustrated in FIG. 1, the first anode 1751 and the second anode 1752 are arranged in the second direction, the second direction is perpendicular to the first direction, and both the first direction and the second direction are located on a plane parallel to the base substrate 110. Therefore, the area occupied by the first extension portion 1751C in the first direction is small, and the overlapping area between the first extension portion and the light transmitting region of the pixel driving circuit can be reduced, so that the light transmittance of the display substrate can be improved.

In some examples, as illustrated in FIGS. 1 and 3A, each anode group 1750 further includes a third anode 1753 and a fourth anode 1754. In each anode group 1750, the first anode 1751 and the second anode 1752 form an anode pair 1758. The third anode 1753, the anode pair 1758 and the fourth anode 1754 are sequentially arranged in the first direction, and the first anode 1751 and the second anode 1752 are sequentially arranged in the second direction. That is, the first direction described above can be the arrangement direction of the third anode, the anode pair and the fourth anode.

For example, the first direction described above can be a row direction of sub-pixel arrangement in the display substrate, that is, the extending direction of a gate line. Of course, the embodiments of the present disclosure include but are not limited thereto, and the first direction described above can also be the column direction of sub-pixel arrangement, that is, an extending direction of the data line.

In some examples, as illustrated in FIG. 1, FIG. 3A and FIG. 3B, the notch region described above includes a first notch 451 located between the first main body portion 1751A and the anode compensation portion 1751E, the orthographic projection of the first notch 451 on the base substrate 110 includes a first edge 401 and a second edge 402 extending in the second direction, the first edge 401 is connected to the orthographic projection of the first connection portion 1751B on the base substrate 110, and the second edge 402 is at the connection line P12 between the first point P1 and the second point P2. That is to say, the first anode 1751 has a notch between the first main body portion 1751A and the anode compensation portion 1751E, and the region between the first main body portion 1751A and the anode compensation portion 1751E just corresponds to the light transmitting region of the pixel driving circuit. Therefore, the display substrate can reduce the overlapping area between the first anode and the light transmitting region of the pixel driving circuit, thereby improving the light transmittance.

For example, the edge of the first notch 451 close to the first main body portion 1751A is connected to the first main body portion 1751A, and the edge of the first notch 451 away from the first main body portion 1751A is flush with the edge of the first connection portion 1751B away from the first main body portion 1751A.

In some examples, as illustrated in FIG. 1, FIG. 3A and FIG. 3B, the area of the orthographic projection of the first notch 451 on the base substrate 110 is greater than ½ of the area of the orthographic projection of the first connection portion 1751B on the base substrate 110. In this case, the area of the first notch is larger, so that the display substrate can greatly reduce the overlapping area of the first anode and the light transmitting region of the pixel driving circuit, thereby improving the light transmittance.

In some examples, as illustrated in FIG. 1, FIG. 3A and FIG. 3B, the notch region described above further includes a second notch 452 located between the first notch 451 and the anode compensation portion 1751E, the orthographic projection of the second notch 452 on the base substrate 110 includes a fourth edge 404 and a fifth edge 405 extending in the second direction, the fourth edge 404 is connected to the orthographic projection of the first extension portion 1751C on the base substrate 110, and the fifth edge 405 is also on the connection line P12 between the first point P1 and the second point P2. That is to say, the first extension portion of the first anode shrinks inward by a certain distance relative to the edge of the first main body portion, so that the first anode can avoid the light transmitting region of the corresponding pixel driving circuit as much as possible, thereby increasing the light transmittance of the display substrate.

For example, the first notch 451 further includes an edge connected to the anode compensation portion 1751E, an edge connected to the second extension portion 1751D, and an edge connected to the second notch 452. in this case, the first notch 451 and the second notch 452 described above can form the notch region 450 described above.

In some examples, as illustrated in FIG. 1, FIG. 3A and FIG. 3B, the area of the orthographic projection of the second notch 452 on the base substrate 110 is greater than ½ of the area of the orthographic projection of the first connection portion 1751B on the base substrate 110. In this case, the area of the second notch is larger, so that the overlapping area of the first anode and the light transmitting region of the pixel driving circuit can be greatly reduced, and the light transmittance can be improved.

In some examples, as illustrated in FIG. 1, FIG. 3A and FIG. 3B, the second anode 1752 includes a second main body portion 1752A and a second connection portion 1752B, the second connection portion 1752B is electrically connected to a pixel driving circuit 215 corresponding to the second anode 1752, an orthographic projection of the second main body portion 1752A on the base substrate 110 covers the first node N1 of the pixel driving circuit 215 electrically connected to the second connection portion 1752B. In this case, because the orthographic projection of the anode compensation portion 1751E on the base substrate 110 covers the first node N1 of the pixel driving circuit 215 connected to the first connection portion 1751B, both the first anode and the second anode cover the first node of the corresponding pixel driving circuit, so that the loads of both are the same, and thus the display quality can be improved.

In some examples, as illustrated in FIG. 1, FIG. 3A and FIG. 3B, the first connection portion 1751B and the second connection portion 1752B are symmetrically arranged about a symmetry axis parallel to the first direction. The first main body portion 1751A and the second main body portion 1752A can also be arranged symmetrically about the symmetry axis. The first connection portion 1751B is at the side of the first main body portion 1751A away from the second main body portion 1752A, and the second connection portion 1752B is at the side of the second main body portion 1752A away from the first main body portion 1751A.

In some examples, as illustrated in FIGS. 1 and 2, each pixel driving circuit 215 further includes a storage capacitor Cst and a light-emitting control line 133, the storage capacitor Cst includes a first electrode plate CE1 and a second electrode plate CE2 arranged in a direction perpendicular to the base substrate 110. The first main body portion 1751A is located at the side of the light-emitting control line 133 in the pixel driving circuit 215 connected to the first connection portion 1751B away from the storage capacitor Cst, and the anode compensation portion 1751E is located at the side of the light-emitting control line 133 away from the first main body portion 1751A.

In some examples, as illustrated in FIGS. 1 and 2, each pixel driving circuit 215 further includes a data line 152 and a power line 151. In each pixel driving circuit 215, the orthographic projection of the second electrode plate CE2 on the base substrate 110, the orthographic projection of the light-emitting control line 133 on the base substrate 110, the data line 152 and the power supply line 151 enclose a first interval region 610, and the area of the first interval region 610 covered by the orthographic projection of the first extension portion 1751C on the base substrate 110 is smaller than ½ of the total area of the first interval region 610. In this display substrate, the first interval region between the second electrode plate and the light-emitting control line is usually a light transmitting region, because the area of the first interval region covered by the orthographic projection of the first extension portion on the base substrate is smaller than ½ of the total area of the first interval region, the display substrate can effectively reduce the overlapping area of the first anode and the light transmitting region of the corresponding pixel driving circuit, thereby improving the light transmittance of the display substrate.

For example, the area of the first interval region 610 covered by the orthographic projection of the first extension portion 1751C on the base substrate 110 can also be smaller than ⅓ of the total area of the first interval region 610.

In some examples, as illustrated in FIGS. 1 and 2, each of the plurality of pixel driving circuits 215 further includes an initialization signal line 141, the orthographic projection of the light-emitting control line 133 in the pixel driving circuit 215 corresponding to the first anode 1751 on the base substrate 110, the orthographic projection of the initialization signal line 141 in the pixel driving circuit 215 corresponding to the second anode 1752 on the base substrate 110, the data line 152 and the power line 151 enclose a second interval region 620, and the area of the second interval region 620 covered by the orthographic projection of the first anode 1751 on the base substrate 110 is smaller than ⅔ of the total area of the second interval region 620. In this display substrate, the second interval region is usually a light transmitting region, because the area of the second interval region covered by the orthographic projection of the first anode on the base substrate is smaller than ⅔ of the total area of the second interval region, the display substrate can effectively reduce the overlapping area of the first anode and the light transmitting region of the corresponding pixel driving circuit, thereby improving the light transmittance of the display substrate.

For example, the area of the second interval region 620 covered by the orthographic projection of the first anode 1751 on the base substrate 110 is smaller than ½ of the total area of the second interval region 620.

In some examples, as illustrated in FIG. 2, the display substrate 100 further includes a pixel defining layer 190 and a light-emitting layer 180. The pixel defining layer 190 is located at the side of the anode layer 170 away from the base substrate 110, and the light-emitting layer 180 is located at the side of the anode layer 170 away from the base substrate 110. The pixel defining layer 190 includes a plurality of openings 195, the plurality of openings 195 are arranged in one-to-one correspondence with the plurality of anodes 175, and each of the plurality of openings 195 partially exposes a corresponding anode 175 in the plurality of anodes 175. The light-emitting layer 180 includes a plurality of light-emitting portions 185, the plurality of light-emitting portions 185 are arranged in one-to-one correspondence with the plurality of openings 195, and at least a part of each of the plurality of light-emitting portion 185 is located in a corresponding opening 195 in the plurality of openings 195 and covers the exposed part of a corresponding anode 175 in the plurality of anodes 175.

In some examples, as illustrated in FIG. 3, the plurality of openings 195 are divided into a plurality of opening groups 1950, each of the plurality of opening groups 1950 includes a first opening 1951 and a second opening 1952, and the plurality of light-emitting portions 185 are divided into a plurality of light-emitting portion groups 1850, each of the plurality of light-emitting portion groups 1850 includes a first light-emitting portion 1851 and a second light-emitting portion 1852. The orthographic projection of the first opening 1951 on the base substrate 110 falls within the orthographic projection of the first main body portion 1751A on the base substrate 110, at least a part of the first light-emitting portion 1851 is located in the first opening 1951 and covers the exposed part of the first main body 1751A, and the shape of the orthographic projection of the first main body portion 1751A on the base substrate 110 is similar to the shape of the orthographic projection of the first opening 1951 on the base substrate 110.

For example, as illustrated in FIG. 3, at least a part of the second light-emitting portion 1852 is located in the second opening 1952 and covers the exposed part of the second main body portion 1752A, and the shape of the orthographic projection of the second main body portion 1752A on the base substrate 110 is similar to the shape of the orthographic projection of the second opening 1952 on the base substrate 110.

For example, as illustrated in FIG. 3, at least a part of the third light-emitting portion 1853 is located in the third opening 1953 and covers the exposed part of the third main body portion 1753A, and the shape of the orthographic projection of the third main body portion 1753A on the base substrate 110 is similar to the shape of the orthographic projection of the third opening 1953 on the base substrate 110.

For example, as illustrated in FIG. 3, at least a part of the fourth light-emitting portion 1854 is located in the fourth opening 1954 and covers the exposed part of the fourth main body portion 1754A, and the shape of the orthographic projection of the fourth main body portion 1754A on the base substrate 110 is similar to the shape of the orthographic projection of the fourth opening 1954 on the base substrate 110.

For example, the first light-emitting portion and the second light-emitting portion are configured to emit light of the same color.

For example, the first light-emitting portion is configured to emit green light, the third light-emitting portion is configured to emit red light, and the fourth light-emitting portion is configured to emit blue light. Of course, embodiments of the present disclosure include but are not limited thereto.

In some examples, as illustrated in FIG. 3, the pixel circuit layer 210 includes a semiconductor layer 120 and a first gate electrode layer 130. The semiconductor layer 120 is located on the base substrate 110, and the first gate electrode layer 130 is located at a side of the semiconductor layer 120 away from the base substrate 110.

FIGS. 4A-4D are schematic plan views of each functional film layer in a display substrate according to an embodiment of the present disclosure. FIG. 5 is an equivalent circuit diagram of a pixel driving circuit in a display substrate according to an embodiment of the present disclosure.

Figure 4A:
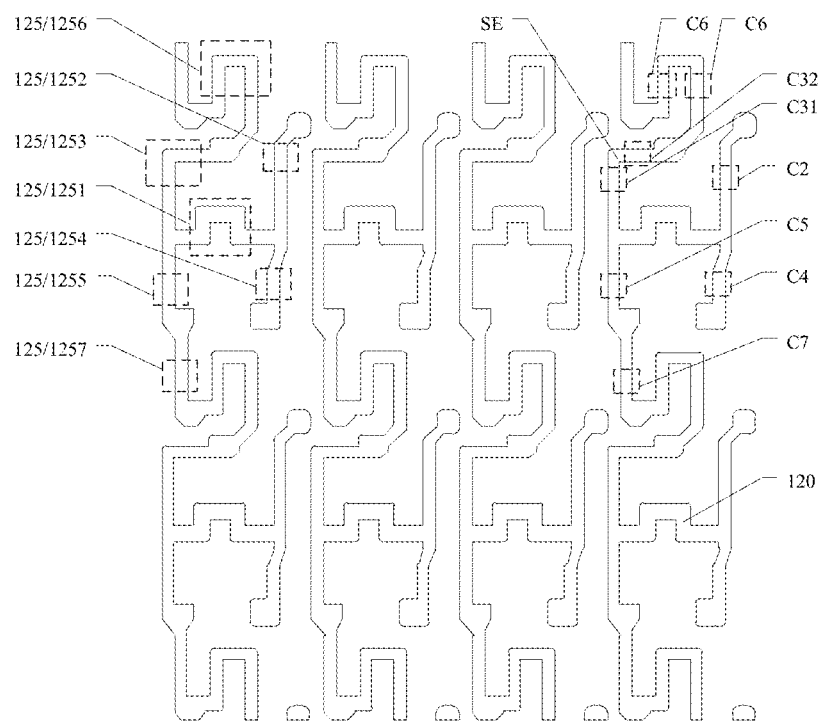
FIGS. 4A-4D are schematic plan views of each functional film layer in a display substrate according to an embodiment of the present disclosure.
Figure 5:
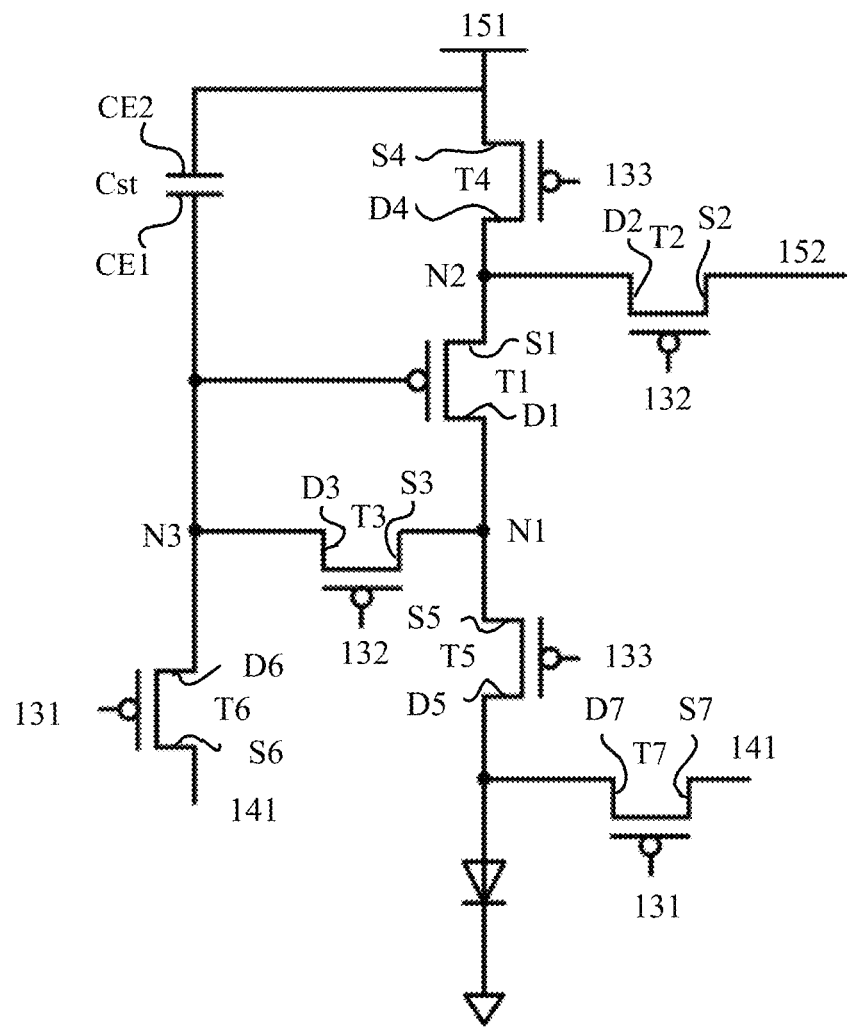
FIG. 5 is an equivalent circuit diagram of a pixel driving circuit in a display substrate according to an embodiment of the present disclosure.

As illustrated in FIG. 4A and FIG. 5, the semiconductor layer 120 includes a plurality of pixel driving units 125 arranged in one-to-one correspondence with the plurality of anodes 175. Each pixel driving unit 125 includes a first unit 1251, a second unit 1252, a third unit 1253, a fourth unit 1254, a fifth unit 1255, a sixth unit 1256 and a seventh unit 1257. The first unit 1251 includes a first channel region C1, and a first source region S1 and a first drain region D1 located at the two sides of the first channel region C1. The second unit 1252 includes a second channel region C2, a second source region S2 and a second drain region D2 on the two sides of the second channel region C2. The third unit 1253 includes a third channel region C3, a third source region S3 and a third drain region D3 at the two sides of the third channel region C3. The fourth unit 1254 includes a fourth channel region C4, and a fourth source region S4 and a fourth drain region D4 at the two sides of the fourth channel region C4. The fifth unit 1255 includes a fifth channel region C5, and a fifth source region S5 and a fifth drain region D5 located at the two sides of the fifth channel region C5. The sixth unit 1256 includes a sixth channel region C6, and a sixth source region S6 and a sixth drain region D6 located at the two sides of the sixth channel region C6. The seventh unit 1257 includes a seventh channel region C7, and a seventh source region S7 and a seventh drain region D7 located at the two sides of the seventh channel region C7.

For example, as illustrated in FIGS. 4A and 5, the third source region S3, the first drain region D1 and the fifth source region S5 are connected to the first node N1, the sixth drain region S6 is connected to the third drain region D3, the first source region S1, the second drain region D2 and the fourth drain region D4 are connected to the second node N2, and the fifth drain region D5 is connected to the seventh drain region D7.

Figure 4B:
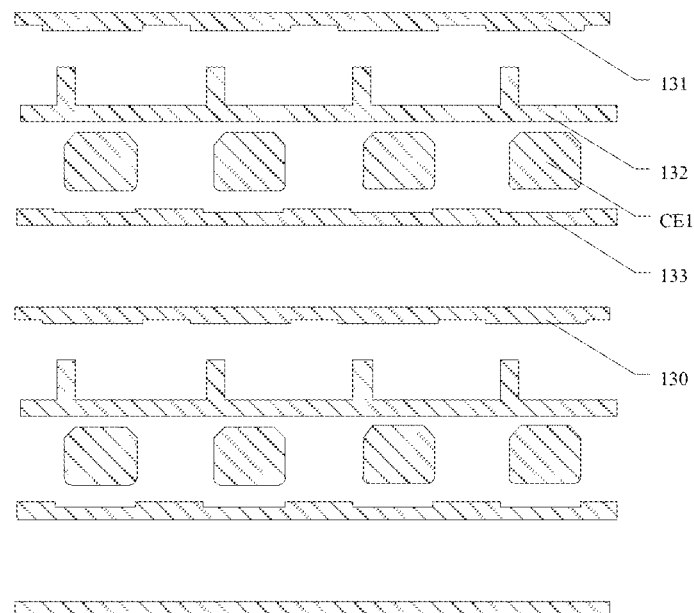

For example, as illustrated in FIG. 4B and FIG. 5, the first gate electrode layer 130 includes a reset signal line 131, a gate line 132, a first electrode CE1 and the light-emitting control line 133. The reset signal line 131 overlaps with the seventh channel region C7 and the sixth channel region C6 to form a seventh thin film transistor T7 and a sixth thin film transistor T6 with the seventh unit 1257 and the sixth unit 1256. The gate line 132 respectively overlaps with the third channel region C3 and the second channel region C2 to form a third thin film transistor T3 and a second thin film transistor T2 with the third unit 1253 and the second unit 1252. The first electrode block CE1 overlaps with the first channel region C1 to form a first thin film transistor T1 with the first unit 1251. The light-emitting control line 133 overlaps with the fourth channel region C4 and the fifth channel region C5 to form a fourth thin film transistor T4 and a fifth thin film transistor T5 with the fourth unit 1254 and the fifth unit 1255. The first thin film transistor T1 is the driving thin film transistor, and the third thin film transistor T3 is the compensation thin film transistor.

In some examples, the reset signal line, the gate line and the light-emitting control line all extend in the first direction, and the reset signal line, the gate line, the first electrode block and the light-emitting control line are arranged in the second direction.

Figure 4C:
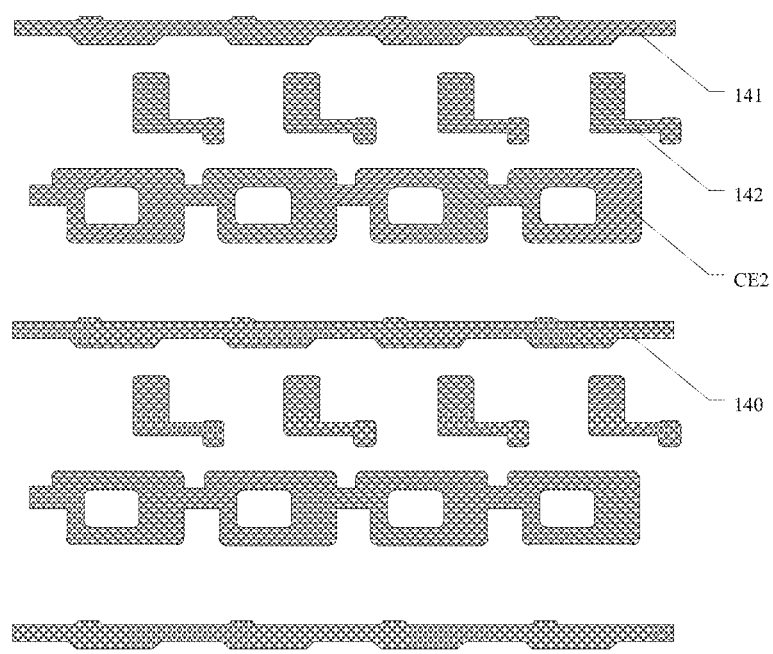

As illustrated in FIGS. 4C and 5, the pixel circuit layer 210 includes a second gate electrode layer 140 located at the side of the first gate electrode layer 130 away from the semiconductor layer 120. The second gate electrode layer 140 includes an initialization signal line 141 and a second electrode block CE2. The initialization signal line 141 is connected to the seventh source region S7 and the sixth source region S6. The orthographic projection of the second electrode block CE2 on the base substrate 110 at least partially overlaps with the orthographic projection of the first electrode block CE1 on the base substrate 110 to form a storage capacitor Cst.

As illustrated in FIGS. 4C and 5, the second gate electrode layer 140 further includes a conductive block 142. For example, the conductive block 142 can be connected to the power line, thereby reducing the resistance of the power line. For another example, the orthographic projection of the conductive block 142 on the base substrate 110 at least partially overlaps with the channel region of the compensation thin film transistor T3, thereby preventing light from directly irradiating the channel region of the compensation thin film transistor T3 and improving the stability of the compensation thin film transistor T3.

Figure 4D:
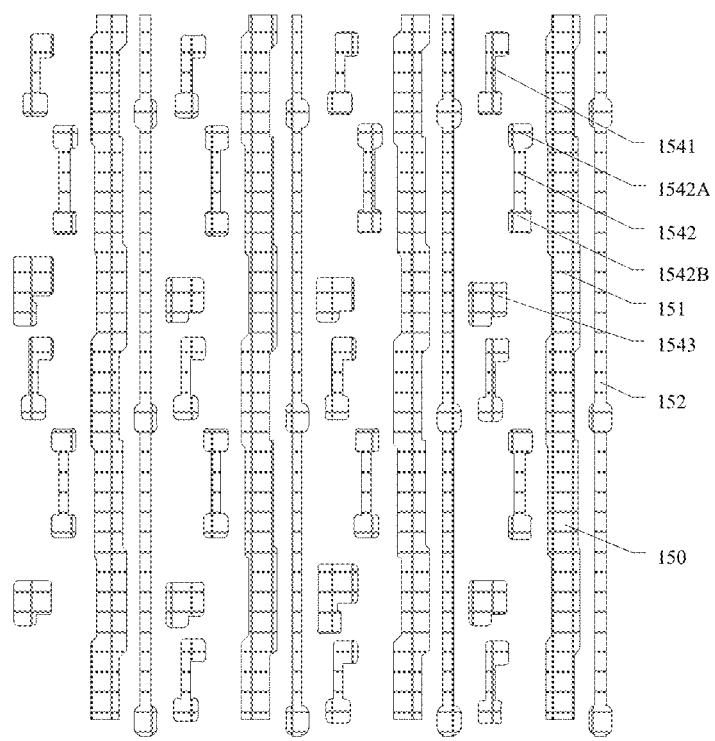

As illustrated in FIG. 4D and FIG. 5, the pixel circuit layer 210 further includes a source-drain electrode layer 150 located at the side of the second gate electrode layer 140 away from the first gate electrode layer 130. The source-drain electrode layer 150 includes a data line 152 and a power line 151. The second source region S2 is connected to the data line 152, and the fourth source region S4 is connected to the power line 151.

As illustrated in FIGS. 4D and 5, the source-drain electrode layer 210 further includes a first connection block 1541, a second connection block 1542 and a third connection block 1543. The first connection block 1541 is used to connect the initialization signal line 141 with the sixth source region S6 and the seventh source region S7. The second connection block 1542 is used to connect the third drain region D3 with the first electrode block CE1. The third connection block 1543 is connected to the fifth drain region D5, and can be used as a drain electrode to be connected to the corresponding anode.

As illustrated in FIG. 4D and FIG. 5, the second connection block 1542 includes a first end 1542A and a second end 1542B, the first end 1542A is connected to the drain region D3 of the compensation thin film transistor T3, and the second end 1542B is connected to the first electrode block CE1. The orthographic projection of the anode compensation portion 1751E on the base substrate 110 covers the orthographic projection of the second end 1542B on the base substrate 110.

As illustrated in FIG. 5, the second source region S2 is connected to the data line 152. The fourth source region S4 is connected to the power line 151. Therefore, the first unit 121, the second unit 122, the third unit 123, the fourth unit 124, the fifth unit 125, the sixth unit 126 and the seventh unit 127 of the semiconductor layer 120 can form the first thin film transistor T1, the second thin film transistor T2, the third thin film transistor T3, the fourth thin film transistor T4, the fifth thin film transistor T5, the sixth thin film transistor T6 and the seventh thin film transistor T7 with the reset signal line 131 and the gate line 132 described above.

Hereinafter, an operation mode of the pixel driving circuit illustrated in FIG. 5 will be schematically described. First, when a reset signal is transmitted to the reset signal line 131 and the seventh thin film transistor T7 is turned on, the residual current flowing through the anode of each sub-pixel is discharged to the sixth thin film transistor T6 through the seventh thin film transistor T7, so that light emission caused by the residual current flowing through the anode of each sub-pixel can be suppressed. Then, when a reset signal is transmitted to the reset signal line 131 and an initialization signal is transmitted to the initialization signal line 141, the sixth thin film transistor T6 is turned on, and an initialization voltage Vint is applied to the first gate electrode of the first thin film transistor T1 and the first electrode block CE1 of the storage capacitor Cst through the sixth thin film transistor T6, so that the first gate electrode and the storage capacitor Cst are initialized. The first gate electrode initialization can turn on the first thin film transistor T1.

Then, when a gate signal is transmitted to the gate line 132 and a data signal is transmitted to the data line 152, both the second thin film transistor T2 and the third thin film transistor T3 are turned on, and a data voltage Vd is applied to the first gate electrode through the second thin film transistor T2 and the third thin film transistor T3. At this time, the voltage applied to the first gate electrode is a compensation voltage Vd+Vth, and the compensation voltage applied to the first gate electrode is also applied to the first electrode block CE1 of the storage capacitor Cst.

Subsequently, the power line 151 applies a driving voltage Vel to the second electrode block CE2 of the storage capacitor Cst, and applies the compensation voltage Vd+Vth to the first electrode block CE1, so that charges corresponding to differences between voltages respectively applied to the two electrodes of the storage capacitor Cst are stored in the storage capacitor Cst, and the first thin film transistor T1 is turned on for a predetermined time.

Subsequently, when an emission control signal is applied to the light-emitting control line 133, both the fourth thin film transistor T4 and the fifth thin film transistor T5 are turned on, so that the fourth thin film transistor T4 applies a driving voltage Vel to the fifth thin film transistor T5. When the driving voltage Vel passes through the first thin film transistor T1 turned on by the storage capacitor Cst, the difference between the corresponding driving voltage Vel and the voltage applied to the first gate electrode through the storage capacitor Cst causes a driving current Id to flow through the first drain region D3 of the first thin film transistor T1, and the driving current Id is applied to each sub-pixel through the fifth thin film transistor T5, so that the light-emitting layer of each sub-pixel emits light.

Figure 6:
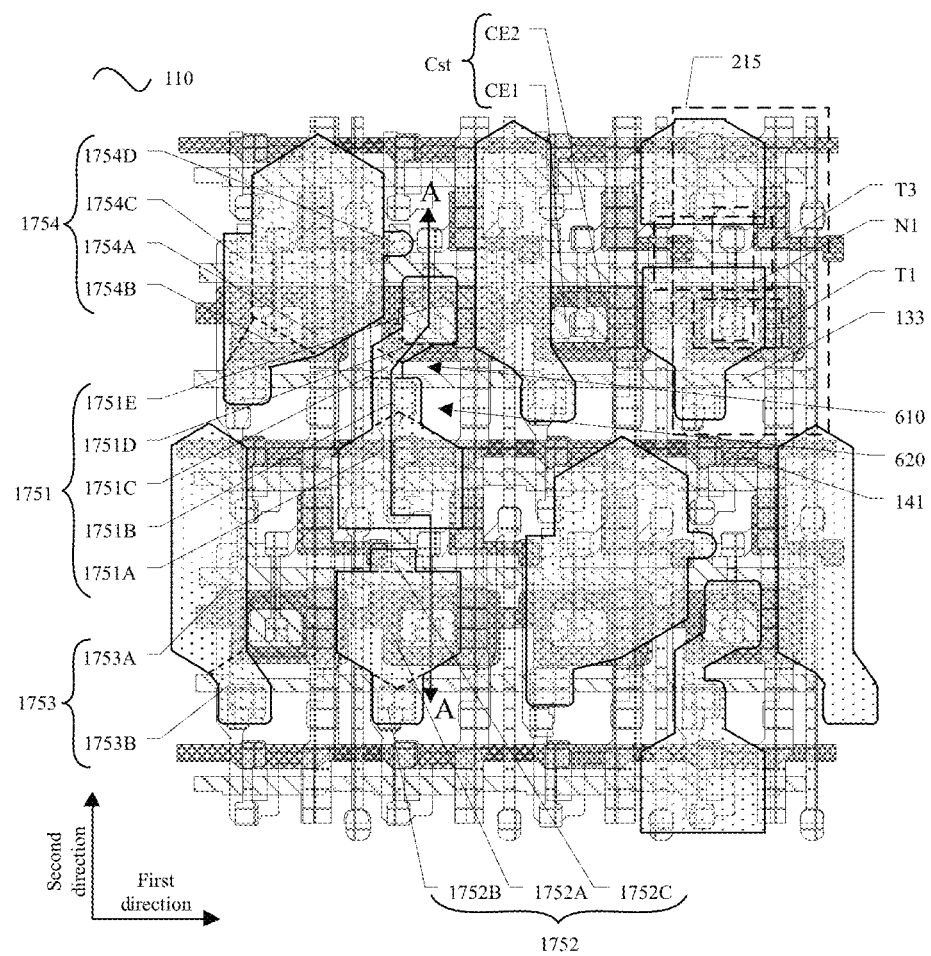
FIG. 6 is a schematic plan view of another display substrate according to an embodiment of the present disclosure.

FIG. 6 is a schematic plan view of another display substrate according to an embodiment of the present disclosure. As illustrated in FIG. 6, the second anode 1752 further includes a first supplementary portion 1752C, the first supplementary portion 1752C is protruded from the second main body portion 1752A in the direction the second main body portion 1752A close to the first anode 1751, and the orthographic projection of the first supplementary portion 1752C on the base substrate 110 at least partially overlaps with the orthographic projection of the channel region of the compensation thin film transistor T3 in the pixel driving circuit 215 electrically connected to the second connection portion 1752B on the base substrate 110.

In the display substrate provided in this example, the pixel driving circuit adopts a 7T1C pixel driving structure, and in the light-emitting stage, the stability of the driving thin film transistor T1 directly affects the long-term light-emitting stability of the organic light-emitting diode display device. In the charging stage, the charging voltage on the gate electrode of the driving thin film transistor T1 is related to the state of the compensation thin film transistor T3. Generally, thin film transistors are very sensitive to light, and when the thin film transistors (especially the channel region) are exposed to light, the characteristics of the thin film transistors will drift easily, which will affect the normal operation of the pixel driving circuit. The first supplementary portion is added on the second anode of the display substrate, and the orthographic projection of the first supplementary portion on the base substrate at least partially overlaps with the orthographic projection of the channel region of the compensation thin film transistor in the pixel driving circuit electrically connected to the second connection portion, so that the display substrate can shield the channel region of the corresponding compensation thin film transistor through the first supplementary portion, thereby improving the stability and service life of the compensation thin film transistor and further improving the long-term light-emitting stability and service life of the display substrate.

It should be noted that when the compensation thin film transistor T3 has a double gate structure, the channel region of the above compensation thin film transistor T3 includes two channel regions and a common electrode between the two channel regions. For example, as illustrated in FIG. 2, the compensation thin film transistor T3 can be a thin film transistor with a double gate structure, so that the reliability of the compensation thin film transistor can be improved. The channel region of the compensation thin film transistor T3 includes a first channel region C31 and a second channel region C32 arranged at intervals, and the compensation thin film transistor T3 further includes a common electrode SE located between the first channel region C31 and the second channel region C32. The orthographic projection of the common electrode SE of the compensation thin film transistor T3 on the base substrate 110 at least partially overlaps with the first supplementary portion 1742C. Therefore, the first supplementary portion can partially or completely shield the common electrode SE of the compensation thin film transistor T3, thereby further improving the stability and service life of the compensation thin film transistor, and further improving the long-term light-emitting stability and service life of the display substrate.

In some examples, as illustrated in FIGS. 1 and 6, the third anode 1753 includes a third main body portion 1753A and a third connection portion 1753B, and the third connection portion 1753B is electrically connected to the pixel driving circuit 215 corresponding to the third anode 1753. The fourth anode 1754 includes a fourth main body portion 1754A and a fourth connection portion 1754B, and the fourth connection portion 1754B is electrically connected to the pixel driving circuit 215 corresponding to the fourth anode 1754.

In some examples, as illustrated in FIG. 6, the fourth anode 1754 further includes a second supplementary portion 1754C protruding from the fourth main body portion 1754A in a direction the fourth main body portion 1754A close to the second anode 1752. For example, the second supplementary portion 1754C is located at the side of the fourth connection portion 1754B close to the fourth main body portion 1754A in the second direction. The orthographic projection of the second supplementary portion 1754C on the base substrate 110 at least partially overlaps with the orthographic projection of the channel region of the compensation thin film transistor T3 in the pixel driving circuit 215 electrically connected to the third connection portion 1753B on the base substrate 110. Therefore, the display substrate can shield the channel region of the compensation thin film transistor corresponding to the third anode through the second supplementary portion, thereby improving the stability and service life of the compensation thin film transistor and further improving the long-term light-emitting stability and service life of the display substrate. Similarly, when the compensation thin film transistor T3 has a double gate structure, the channel region of the compensation thin film transistor T3 includes two channel regions and a common electrode between the two channel regions.

In some examples, as illustrated in FIG. 6, the fourth anode 1754 further includes a third supplementary portion 1754D protruding from the fourth main body portion 1754A in a direction the fourth main body portion 1754A away from the second anode 1752, and the orthographic projection of the third supplementary portion 1754D on the base substrate 110 at least partially overlaps with the orthographic projection of the channel region of the compensation thin film transistor T3 in the pixel driving circuit 215 electrically connected to the first connection portion 1751B on the base substrate 110. Therefore, the display substrate can shield the channel region of the compensation thin film transistor corresponding to the first anode through the third supplementary portion, thereby improving the stability and service life of the compensation thin film transistor and further improving the long-term light-emitting stability and service life of the display substrate. Similarly, when the compensation thin film transistor T3 has a double gate structure, the channel region of the compensation thin film transistor T3 includes two channel regions and a common electrode between the two channel regions.

Figure 7:
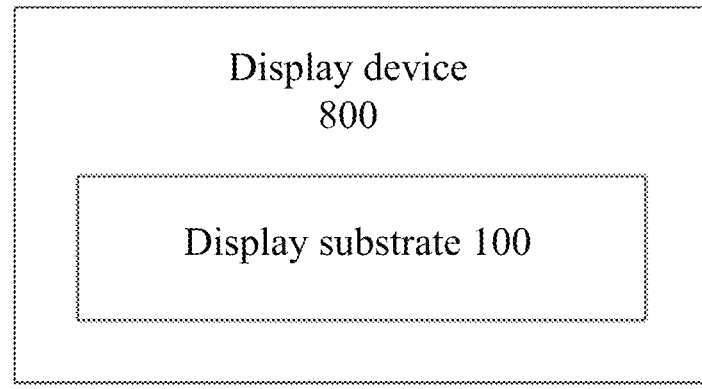
FIG. 7 is a schematic diagram of a display device according to an embodiment of the present disclosure.

At least one embodiment of the present disclosure further provides a display device. FIG. 7 is a schematic diagram of a display device according to an embodiment of the present disclosure. As illustrated in FIG. 7, the display device 800 includes the display substrate 100 of any one of the above. Therefore, the display device has beneficial effects corresponding to the beneficial effects of the display substrate, for example, the display device has higher light transmittance. In addition, the display device can improve the stability and service life of the compensation thin film transistor, thereby improving the long-term light-emitting stability and service life of the display substrate.

For example, the display device can be electronic products with display functions such as televisions, computers, notebook computers, flat computers, mobile phones, navigators, and electronic photo frames, etc.

The following statements need to be explained:
(1) In the drawings of the embodiments of the present disclosure, only the structures related to the embodiments of the present disclosure are involved, and other structures may refer to the common design(s).
(2) In case of no conflict, features in one embodiment or in different embodiments of the present disclosure can be combined.

The above are merely exemplary embodiments of the present disclosure but are not limitative to the scope of the present disclosure; the scopes of the present disclosure should be defined in the appended claims.

The invention claimed is:

1. A display substrate, comprising:
   a base substrate;
   a pixel circuit layer, on the base substrate;
   an anode layer, at a side of the pixel circuit layer away from the base substrate,
   wherein the pixel circuit layer comprises a plurality of pixel driving circuits, the anode layer comprises a plurality of anodes, and the plurality of pixel driving circuits are arranged in one-to-one correspondence with the plurality of anodes,
   the plurality of anodes comprise a plurality of anode groups arranged in an array along a first direction and a second direction, each of the plurality of anode groups comprises a first anode and a second anode which are oppositely arranged in the second direction, the first anode comprises a first main body portion and a first connection portion, and the first connection portion is electrically connected to a pixel driving circuit corresponding to the first anode,
   the first anode further comprises an extension portion and an anode compensation portion, wherein an orthographic projection of the anode compensation portion on the base substrate covers one thin film transistor in the pixel driving circuit connected to the first connection portion,
   the first main body portion and the anode compensation portion at least partially overlap in the first direction, a first center line of the anode compensation portion extending in the second direction is at a first side of a second center line of the first main body portion extending in the second direction, the anode compensation portion has a first point at a side away from the second center line, and the first main body portion has a second point at the first side,
   the first anode and a connection line between the first point and the second point enclose a notch region, and an area of the notch region is greater than at least one of an area of the anode compensation portion and an area of the first connection portion.

2. The display substrate according to claim 1, wherein the area of the notch region is greater than a sum of the area of the anode compensation portion and the area of the first connection portion.

3. The display substrate according to claim 1, wherein the anode compensation portion is at the first side of the second center line extending in the second direction of the first main body portion extending in the second direction.

4. The display substrate according to claim 1, wherein the extension portion comprises a first extension portion and a second extension portion, the first extension portion is at a side of the first connection portion away from the first main body portion, the second extension portion is respectively connected to the first extension portion and the anode compensation portion, and the first extension portion is at a side of the second extension portion away from the anode compensation portion.

5. The display substrate according to claim 4, wherein a third center line of the first extension portion extending in the second direction is at a second side of the second center line of the first main body portion extending in the second direction, and the second side is opposite to the first side.

6. The display substrate according to claim 5, wherein the first extension portion is at the second side of the second center line of the first main body portion extending in the second direction.

7. The display substrate according to claim 1, wherein an orthographic projection of the notch region on the base substrate does not overlap with an orthographic projection of the first anode on the base substrate.

8. The display substrate according to claim 1, wherein a fourth center line of the first connection portion extending in the second direction is at the first side of the second center line of the first main body portion.

9. The display substrate according to claim 1, wherein each of the plurality of pixel driving circuits comprises a driving thin film transistor and a compensation thin film transistor, a drain electrode of the driving thin film transistor and a source electrode of the compensation thin film transistor are connected to a first node,
   an orthographic projection of the anode compensation portion on the base substrate covers the first node of a pixel driving circuit connected to the first connection portion.

10. The display substrate according to claim 4, wherein a size of the first connection portion in the first direction is smaller than a size of the first main body portion in the first direction, and a size of the first extension portion in the first direction is smaller than a size of the first connection portion in the first direction.

11. The display substrate according to claim 10, wherein each of the plurality of anode groups further comprises a third anode and a fourth anode; in each of the plurality of anode groups, the first anode and the second anode form an anode pair, the third anode, the anode pair and the fourth anode are arranged in sequence in the first direction, and the first anode and the second anode are arranged in sequence in the second direction,
   the notch region comprises a first notch between the first main body portion and the anode compensation portion,
   an orthographic projection of the first notch on the base substrate comprises a first edge and a second edge extending in the second direction, the first edge is connected to an orthographic projection of the first connection portion on the base substrate, and the second edge is on a connection line between the first point and the second point.

12. The display substrate according to claim 11, wherein an area of the orthographic projection of the first notch on the base substrate is greater than ½ of an area of the orthographic projection of the first connection portion on the base substrate.

13. The display substrate according to claim 11, wherein the notch region further comprises a second notch between the first notch and the anode compensation portion,
   an orthographic projection of the second notch on the base substrate comprises a fourth edge and a fifth edge extending in the second direction, the fourth edge is connected to an orthographic projection of the first extension portion on the base substrate, and the fifth edge is also on the connection line between the first point and the second point.

14. The display substrate according to claim 13, wherein an area of the orthographic projection of the second notch on the base substrate is greater than ½ of an area of the orthographic projection of the first connection portion on the base substrate.

15. The display substrate according to claim 1, wherein the second anode comprises a second main body portion and a second connection portion, the second main body portion is electrically connected to a pixel driving circuit corresponding to the second anode, and an orthographic projection of the second main body portion on the base substrate covers a first node of the pixel driving circuit electrically connected to the second connection portion, the first connection portion and the second connection portion are symmetrically arranged about a symmetry axis parallel to the first direction, wherein the first connection portion is at a side of the first main body portion away from the second main body portion, and the second connection portion is at a side of the second main body portion away from the first main body portion.

16. The display substrate according to claim 15, wherein the second anode further comprises a first supplementary portion, the first supplementary portion is protruded from the second main body portion in a direction the second main body portion close to the first anode, an orthographic projection of the first supplementary portion on the base substrate at least partially overlaps with an orthographic projection of a channel region of the compensation thin film transistor in the pixel driving circuit electrically connected to the second connection portion on the base substrate.

17. The display substrate according to claim 4, wherein each of the plurality of pixel driving circuits further comprises a storage capacitor and a light-emitting control line, the storage capacitor comprises a first electrode plate and a second electrode plate arranged in a direction perpendicular to the base substrate, the first main body portion is at a side of the light-emitting control line in the pixel driving circuit connected to the first connection portion away from the storage capacitor, and the anode compensation portion is at a side of the light-emitting control line away from the first main body portion.

18. The display substrate according to claim 17, wherein each of the plurality of pixel driving circuits further comprises a data line and a power line, in each of the plurality of pixel driving circuits, an orthographic projection of the second electrode plate on the base substrate, an orthographic projection of the light-emitting control line on the base substrate, the data line and the power line enclose a first interval region, and an area of the first interval region covered by an orthographic projection of the first extension portion on the base substrate is smaller than ½ of a total area of the first interval region.

19. The display substrate according to claim 18, wherein each of the plurality of pixel driving circuits further comprises an initialization signal line, an orthographic projection of the light-emitting control line in a pixel driving circuit corresponding to the first anode on the base substrate, an orthographic projection of the initialization signal line in a pixel driving circuit corresponding to the second anode on the base substrate, the data line and the power line enclose a second interval region, and an area of the second interval region covered by an orthographic projection of the first anode on the base substrate is smaller than ⅔ of a total area of the second interval region.

20. A display device comprising the display substrate according to claim 1.

* * * * *